(12) United States Patent
Launay

(10) Patent No.: US 7,243,854 B2
(45) Date of Patent: Jul. 17, 2007

(54) ANTI-INTRUSION SMART CARD

(75) Inventor: François Launay, Epron (FR)

(73) Assignee: Oberthur Card Systems SA, Paris (FR)

( * ) Notice: Subject to any disclaimer, the term of this patent is extended or adjusted under 35 U.S.C. 154(b) by 0 days.

(21) Appl. No.: 10/563,365

(22) PCT Filed: Jul. 6, 2004

(86) PCT No.: PCT/FR2004/001756

§ 371 (c)(1),
(2), (4) Date: Mar. 16, 2006

(87) PCT Pub. No.: WO2005/008577

PCT Pub. Date: Jan. 27, 2005

(65) Prior Publication Data
US 2006/0151361 A1    Jul. 13, 2006

(30) Foreign Application Priority Data
Jul. 11, 2003    (FR) .................................. 03 08551

(51) Int. Cl.
G06K 19/06    (2006.01)
(52) U.S. Cl. ...................................... 235/492; 235/488
(58) Field of Classification Search ................ 235/492, 235/488
See application file for complete search history.

(56) References Cited

U.S. PATENT DOCUMENTS

| | | | |
|---|---|---|---|
| 5,510,720 A * | 4/1996 | Vauclin | 324/652 |
| 6,631,847 B1 * | 10/2003 | Kasahara et al. | 235/487 |
| 6,719,205 B1 * | 4/2004 | Puschner et al. | 235/492 |
| 6,839,963 B1 * | 1/2005 | Haghiri-Tehrani et al. | 29/852 |
| 6,851,618 B2 * | 2/2005 | Halope | 235/492 |
| 7,028,909 B2 * | 4/2006 | Zercher | 235/488 |
| 7,073,723 B2 * | 7/2006 | Furst et al. | 235/492 |

FOREIGN PATENT DOCUMENTS

| | | |
|---|---|---|
| EP | 0 414 316 | 2/1991 |
| FR | 2 801 999 | 6/2001 |
| WO | WO 03/015169 | 2/2003 |

* cited by examiner

Primary Examiner—Kimberly D. Nguyen
(74) Attorney, Agent, or Firm—Young & Thompson

(57) ABSTRACT

A smart card includes: a plastic body, a module integral with the body and including a support bearing external electric connection pads, at least one electronic chip borne by the support and having one side called active surface bearing internal electric connection pads, and runs electrically connecting the external and internal electric connection pads, respectively. The invention is characterized in that at least one of the runs includes a conductor strip which is configured and arranged so as to project above the active surface while concealing at least a substantial part with at least one large-sized portion and has at least one small-sized portion adapted to involve easy disconnection by rupture upon displacement of the strip or elimination of all or part of the strip relative to the active surface.

18 Claims, 6 Drawing Sheets

ANTI-INTRUSION SMART CARD

PRIOR ART

A smart card generally consists of an electronic module M attached to a plastics material card body or support S, in practice by means of a resin or an adhesive, as shown in the FIG. 1 diagram.

The electronic module M is a microcircuit comprising one or more microprocessors (or more generally electronic "microchips") MP electrically connected to a printed circuit CI (or to a conductive grid) carrying the external electrical contacts C of the microchip. The two connection techniques most frequently used are:

- wire bonding (see FIG. 2): the microchip MP is connected to the external contacts C by gold or aluminum connecting wires F embedded in the protective resin R, and
- flip chip mounting (see FIG. 3): the microchip MP is connected to the external contacts C by conductive bosses B, in practice embedded in the protective resin or adhesive R, electrically connected to metallization areas Z disposed opposite to the external contacts and extending over the internal wall of transverse passages CT, to connect to these external contacts.

It is to be noted that the face A of the microchip carrying in particular its connecting areas and its memory blocks (not shown), i.e. the face on which, in practice, all the operations of producing the microcircuit constituting the microprocessor have been effected beforehand, which is called the "active face", is situated opposite to the printed circuit in the case of wire bonding connections (downward in FIG. 2) and faces the printed circuit in the case of flip chip connections (i.e. upward in FIG. 3).

It is also to be noted that in certain cards (in particular those of the dual interface type), the chip is connected not only to the external contacts but also to the ends of an antenna ANT inside the card body (FIG. 4).

The plastics material support carries the printed imagery of the card and sometimes (in particular in the case of bank cards or identity cards) security features making the card difficult to reproduce (holograms, "invisible" ink, patterns that are complex to print, etc.).

However, there are many fraud techniques, certain of which are based on analyzing the behavior of the chip when it is operating. For example, a fraudster can apply optical means (flash, laser, etc.) to selected areas of the active face to interfere with the operation of the microprocessor and to analyze the response of the microprocessor to that interference.

The above technique necessitates visual access to the microchip whilst at the same time maintaining the integrity of the electrical connections in order to enable it to operate.

Said visual access is obtained either by removing the portion of the plastics material support constituting the bottom of the cavity to which the module is attached in the case of a wire bonded microchip (dashed line area in FIG. 5) or by removing the portion of the printed circuit facing the microchip in the case of a flip chip connected microchip (dashed line area in FIG. 6).

The methods used include milling, spot-facing, etching with acid and applying solvents.

Thus visual access is obtained directly if the resin or the adhesive between the wires (or between the bosses in the case of a flip chip connection) is transparent.

If the resins or adhesives contain pigments that render them visually opaque, it is possible either to use lasers functioning at specific wavelengths at which the resins or adhesives are transparent or to dissolve the resins or adhesives locally using acids or solvents that do not affect the active face of the microprocessor or its electrical connections (FIG. 7A or FIG. 7B, in which the attack is represented by an arrow).

The benefit for the fraudster of leaving the module in the card is the possibility of using the card again after analyzing it, complete with the security elements of the plastics material support, after concealing the "hole".

TECHNICAL PROBLEM ADDRESSED BY THE INVENTION

An object of the present invention is to provide a smart card structure whereby any intrusion aimed at creating direct visual access to the active face of the microprocessor leads to irreversible disconnection of the microcircuit even though the module remains attached to its plastics material support, as a consequence of which it is therefore no longer possible to operate the microchip on its support by interfering with the active face in a controlled manner using optical means.

TECHNICAL SOLUTION PROPOSED BY THE INVENTION

To this end the invention proposes a smart card including:
- a plastics material body,
- a module attached to that body and comprising a support carrying external electrical connection areas,
- at least one electronic microchip carried by said support and having a face called "active face" carrying internal electrical connection areas, and
- respective electrical connections between said external electrical connection areas and said internal electrical connection areas, characterized in that at least one of said connections includes a conductive track that is conformed and disposed so as to overlie the active face, visually concealing a significant portion thereof with at least one wide portion, and has at least one narrow portion adapted to bring about easy disconnection by breakage thereof in the event of moving that track or eliminating the whole or a portion of that track facing the active face.

Thus the invention proposes making one or more of the electrical connections between the microprocessor and the printed circuit by means of opaque conductive tracks visually concealing a significant portion of said microprocessor so that direct visual observation of and optical interference with the active face of said microprocessor necessarily destroys said tracks beforehand, thereby disconnecting said microprocessor and rendering it inoperative.

In the present context, the expression "a significant portion of the active face" refers to a portion that is sufficiently large, in terms of the area of the active face or in terms of the nature of the components thereon, to minimize optical access to that active face with the aim of causing ill-timed operation of the microchip(s).

According to preferred features of the invention, which may where applicable be combined:
- at least certain of the connections include conductive tracks conformed and disposed so as to be conjointly complementary to conceal the major portion of said active face; there are therefore at least two conductive tracks which, over a portion of their length, have shapes which are complementary (but always without contact) in order to mask a significant portion of the active face (the expression "the major portion" means more than 50% or even more than 75% of the area of the active face), at least said conductive track consists of alternating patterns of larger area adapted to conceal visually a significant portion of said at least one electronic microchip and patterns of smaller area adapted to break easily in the event of an attempt to move that track or an attempt to eliminate the whole or a portion of that track facing the microchip; in this way each track includes a plurality of points that will rupture readily in the event of an attempt to move the track or to eliminate the whole or a portion of the track facing the active face, said at least one electronic microchip having its active face facing the bottom of the cavity in the plastics material body; and at least said conductive track is formed on the bottom of said cavity and overlies said active face, concealing a significant portion thereof from visual observation; this is a variant of the wire bonding connection cited above; said conductive track may be formed on the bottom and lateral walls of the cavity, or to the contrary under the bottom thereof (for example carried by an inlet embedded in the body and connected to conductive wells), said at least one electronic microchip having its active face facing the support of the module opposite the external connecting areas, at least said conductive track is formed on an internal face of the support aligned with said active face and concealing a significant portion thereof from visual observation; this is a variant of the flip chip connection cited above, at least said conductive track is formed on the bottom and the lateral walls of said cavity, being electrically connected to a first intermediate area formed on an internal face of the support of the module and electrically connected to one of the internal connecting areas and to a second intermediate area electrically connected to an external connecting area; it is to be noted that this conformation of the track may be used regardless of the orientation of the active face: it is proposed hereinabove when the active face faces the bottom of the cavity, but it may also be used when the active face faces the internal face of the support, with connections between the internal connection areas and intermediate areas themselves connected to external areas via tracks on the bottom and the sides of the cavity: this protects both faces of the microchip, at least said conductive track is produced by photo-etching, or alternatively by depositing a conductive ink or by stamping or embossing a metal film; these techniques may of course coexist in the same card, even if, to simplify fabrication, it is in practice preferable to use only one way of materializing the tracks, the card includes an internal antenna electrically connected to the microchip(s), for example in a card of the dual interface type cited above.

LIST OF FIGURES

The invention will be better understood in the light of the following explanations, which are given by way of illustrative and nonlimiting example and with reference to the appended drawings, in which:

FIG. 1 is a schematic diagram of a smart card,

FIG. 2 is a schematic diagram to a larger scale of the module from the FIG. 1 card in the case of wire bonded connections, FIG. 3 is a schematic diagram to a larger scale of the module from the FIG. 1 card in the case of connections by bosses, FIG. 4 is a schematic diagram of a smart card with an internal antenna, FIG. 5 is a diagram similar to that of FIG. 1 in the case of a module with wire bonded connections, showing an intrusion, FIG. 6 is a diagram similar to that of FIG. 1 in the case of a module with connections by bosses, showing an intrusion, FIG. 7A is a diagram similar to that of FIG. 5, showing an attack by uncovering the active face, FIG. 7B is a diagram similar to that of FIG. 6, showing an attack by uncovering the active face, FIG. 8 is a schematic diagram of the connections of a module of a conventional smart card, showing from below the wire bond connections between metallization areas of the microchip and external contacts of the module, FIG. 9 is a schematic diagram of the connections of the module of a smart card of the invention, showing from below the connections between a metallization area of the microchip and an external contact of the module via intermediate areas and a conductive track at the bottom of the cavity in the card support, FIG. 10 is a partial view of this card in exploded view along the track shown in FIG. 9, FIG. 11 is a diagram analogous to that of FIG. 9, with the same number of metallization areas and external contacts as the FIG. 8 diagram, FIG. 12 is a plan view showing one form of the four tracks shown in FIG. 11, FIG. 13 is another plan view of another form of the track shown in FIG. 9 or FIG. 11, FIG. 14 is another plan view of a pair of tracks conforming to the embodiment shown in FIG. 13, FIG. 15 is a schematic diagram of the connections of a module of a conventional smart card, showing from above connections by bosses between metallization areas of the microchip (seen as if by transparency) and external contacts of the module, FIG. 16 is an analogous diagram showing the connecting tracks of a module of the invention, FIG. 17 is a view in section of a smart card analogous to that of FIG. 10 but including an antenna, shown partly in section along a track and partly outside the track, and FIG. 18 is a partial view of another card that is a variant of the FIG. 10 card.

DETAILED DESCRIPTION OF THE INVENTION

FIG. 8 shows the conventional wire bonding connection technique in which the internal connecting areas (Z1, Z2, Z3, Z4, Z5) of the microprocessor MP are connected by conductive wires to the external connecting areas (X1, X2, X3, X4, X5) via open-ended holes formed in the support of the printed circuit (see also FIG. 2). In the drawings, no distinction is made between the printed circuit and its support.

The internal and external connecting areas are in practice produced by metallization.

FIG. 9 is a diagram of an embodiment of the invention in which there is a wire bonded connection between a metallization area Z1' and a first intermediate internal area Z1' (that is not open), connected to a second intermediate internal area X1', in turn electrically connected to the external area X1' to which the metallization area Z1 of the microprocessor shown in FIG. 8 is directly connected.

The connection between the two intermediate internal areas is provided by a conductive track a on the bottom of the cavity (see FIG. 10), crossing it in vertical alignment with the microprocessor MP so as to conceal it visually, at least in part. It is seen in this figure that the intermediate areas Z1' and X1' are both on the internal face of the support CI of the module, facing metallized areas 11 and 12 formed on plateaus at the periphery of the cavity 13 and connected by virtue of the conductive track descending the plateaus along an edge of the cavity, extending across the bottom (here along a curved line) and rising up another edge to reach the other plateau.

In the variant represented in FIG. 18, the conductive track a is buried in the card body, under the bottom of the cavity, and is connected to the plateaus 11 and 12 by wells P and R. To be more precise, this track a, parallel to the faces of the card body, is carried by an inlet integrated into the plastics material structure of the card body and the wells P and R extend from that track a to the level of the plateaus 11 and 12 (the wells are excavated when spot facing the cavity and then filled with conductive adhesive, for example).

FIGS. 11 to 13 show a non-exhaustive selection of potential configurations of the tracks formed on (or under) the bottom of the cavity to provide satisfactory concealment of the microprocessor whilst at the same time being easily and automatically disconnected in the event of an attempt to move or to eliminate the whole or a portion of one of the tracks in order to obtain visual or optical access to the active face of the microprocessor.

An attempt to eliminate the whole or a portion of a track may consist in removing a portion of track facing a portion of the active face that is to be attacked optically. This may be achieved by applying to the track a chemical solvent, a milling machine or simply a cutter.

In FIG. 11, four of the electrical connections of the microprocessor are made by tracks a, b, c and d crossing the bottom of the cavity. In so far as they cross a central area of the bottom of the cavity, in theory, removing the bottom of the cavity to obtain visual access to the active face of the microprocessor will break at least one of the tracks.

FIG. 12 shows one potential shape of one of the tracks on the bottom of the cavity of the card aimed at optimizing the area of the microprocessor concealed from visual observation. Massive portions alternate with narrow portions that break easily at the slightest mechanical force.

To be more precise, each track here comprises a massive portion whose overall shape is that of a right-angle isosceles triangle with a slot locally reducing the width of this track in the massive portion thereof. Here these tracks are disposed so that the summits of the massive portions are in immediate proximity (without touching each other, to prevent a short circuit). The tracks thus together form a square adapted to conceal the major portion of the microprocessor and in any event its central portion (only the corners remain uncovered, but in practice they do not include any of the important components).

Because of the slots, any attempt at intrusion via the bottom of the cavity is virtually certain to break at least one of the tracks.

The tracks therefore mask the active face at the same time as having weak points causing disconnection in the event of attempted intrusion by moving the tracks away from the masking areas.

FIG. 13 shows only one of the connections: the track a connecting the areas Z1' and X1', not shown, crosses the card but its shape alternates large areas (to conceal the microprocessor) and small portions (to facilitate breakage). To be more precise, the track has a succession of transverse rectangles each connected to the next one (or to the preceding one) by a short connecting strip at a location in the transverse direction that varies at random from one strip to the next, which makes it impossible to predict how to attempt intrusion via the track without running the risk of damaging it, in particular by breaking one of the strips.

Here the conductive tracks a, b, c, d and e are no longer deposited on the bottom of the cavity, but on the internal face of the support of the module.

As previously, these tracks are disposed and conformed to conceal the major portion of the active face of the microprocessor. As in the examples cited above, each of the tracks a, b, c and e features massive portions alternating with narrow portions, concealing a large fraction of the area of the active face and at the same time achieving a very high probability of breakage in the event of an attempt to move one of the tracks or to eliminate the whole or a portion of the track to obtain access to that active face.

Figure 1:
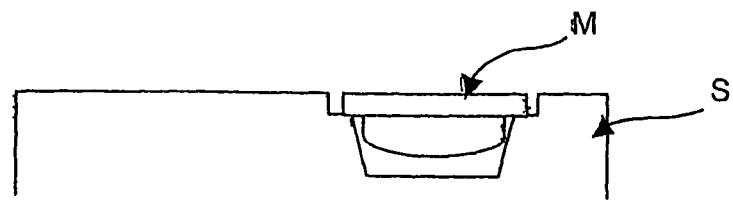
Figure 2:
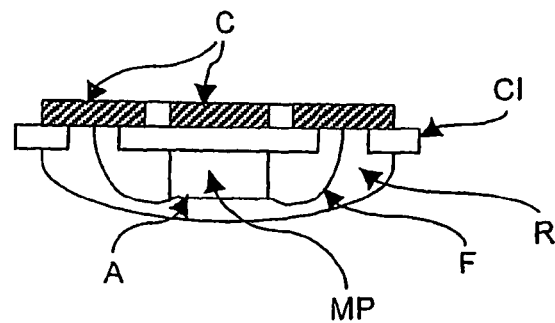
Figure 3:
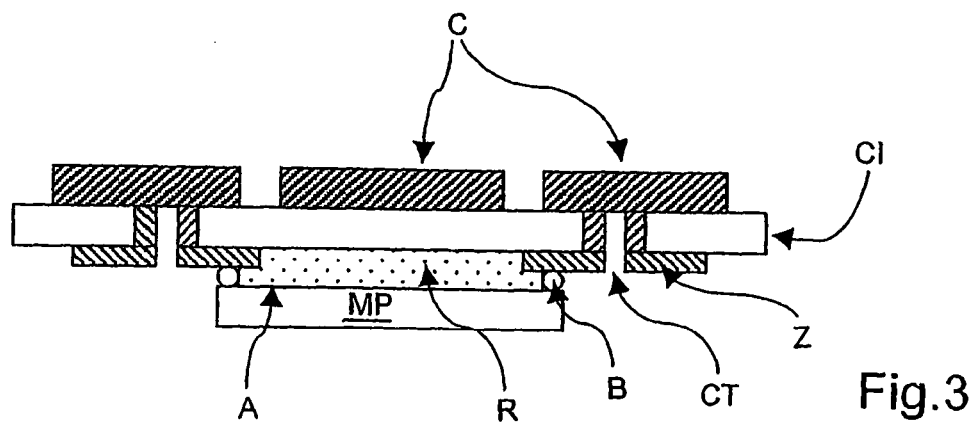
Figure 4:
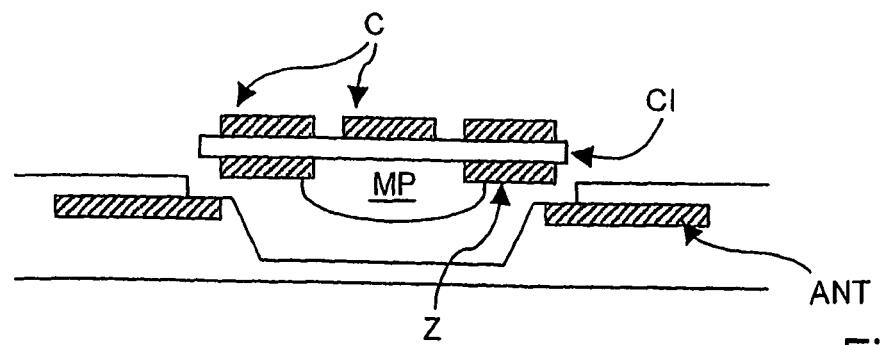
Figure 5:
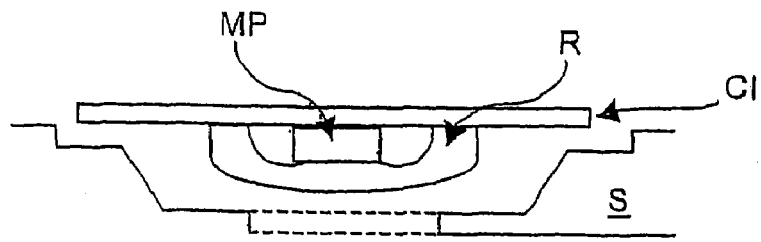
Figure 6:
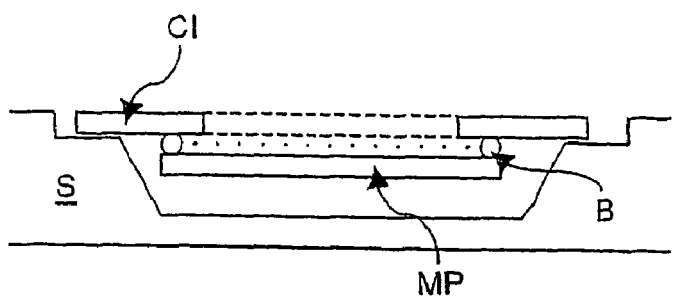
Figure 7A:
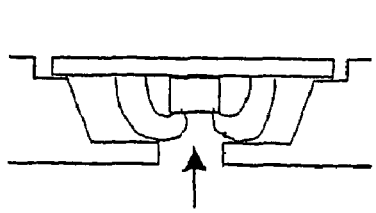
Figure 7B:
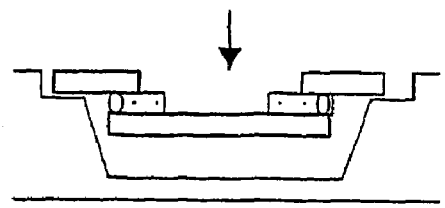
Figure 8:
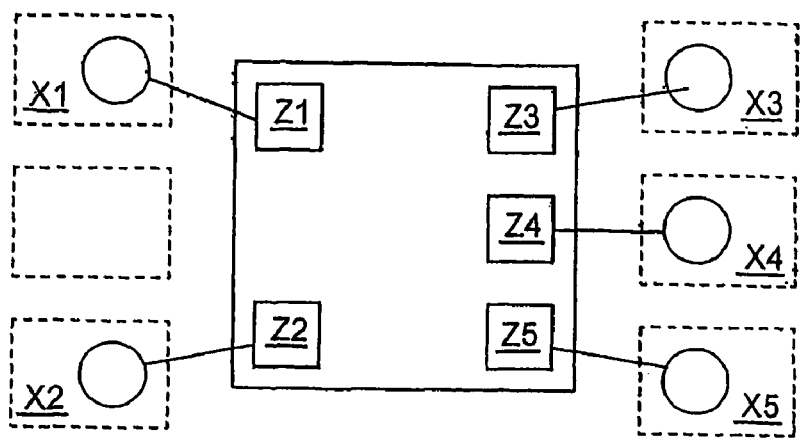
Figure 9:
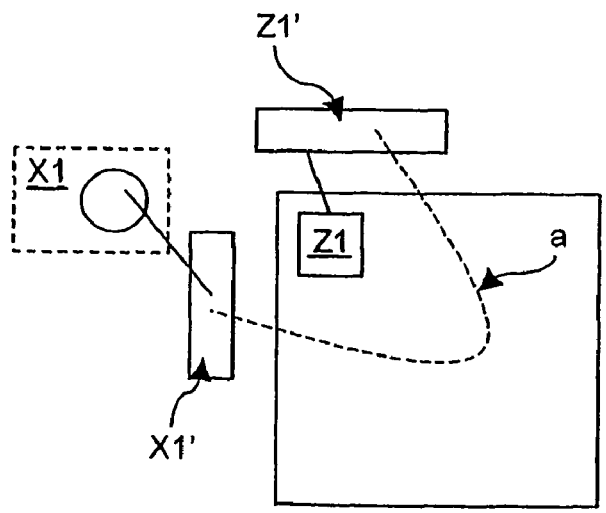
Figure 16:
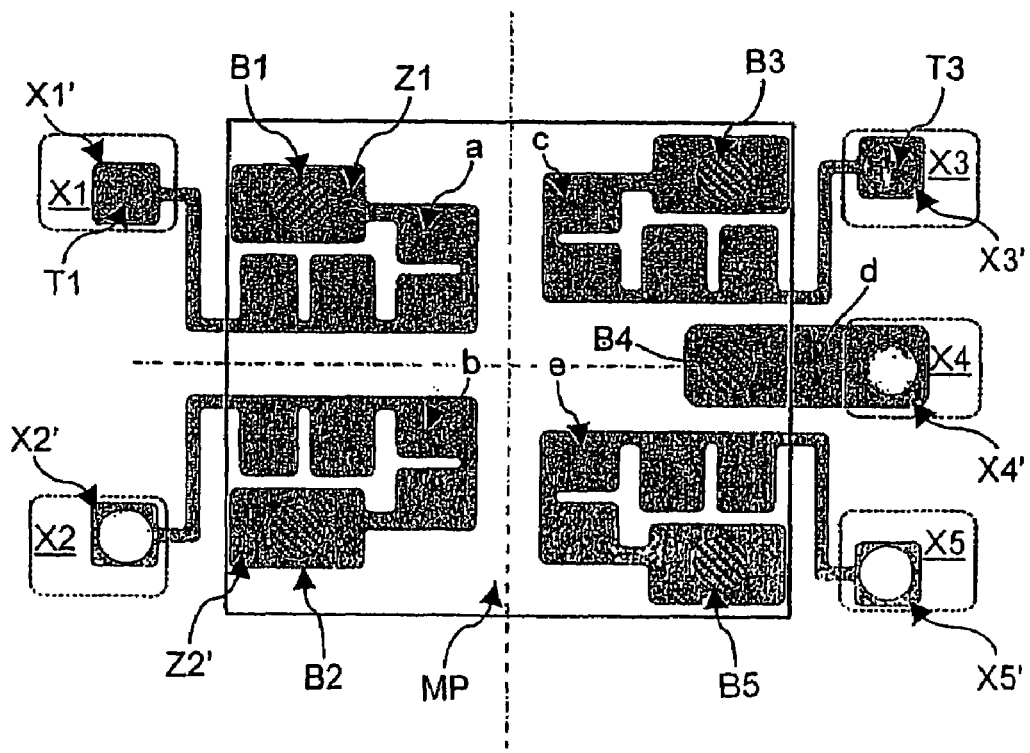
FIG. 16 represents an analogous configuration, but applied to a microchip module with flip chip connections (i.e. that is overturned), the conventional mode of connection of which is shown in FIG. 15.

In fact, a direct connection shown diagrammatically in FIG. 16 corresponds in practice to a direct connection of a boss from FIG. 3 against the area Z connected to an external contact by a via T (the boss and the external contact are denoted B4 and X4 in FIG. 16). On the other hand, the arrangement of the conductive tracks a, b, c and e divides the FIG. 3 area Z into a first intermediate area Z1', Z2', Z3', or Z5' in contact with the boss B1, B2, B3 or B5 and a second intermediate area X1', X2', X3' or X5' in contact with the external contact areas X1, X2, X3 and X5 represented in dashed outline.

It goes without saying that there is a wide variety of configurations in terms of the shape and the position of the intermediate area connecting tracks. The design rules for said tracks are aimed in principle at facilitating their disconnection at the same time as maximizing their capacity to conceal visually the microprocessor.

The alternating wide and narrow sections and/or zigzag configurations may be combined, non-exhaustively, the present invention aiming above all else at the principle of visual protection of the microprocessor by conductive tracks that are disconnected easily.

Figure 15:
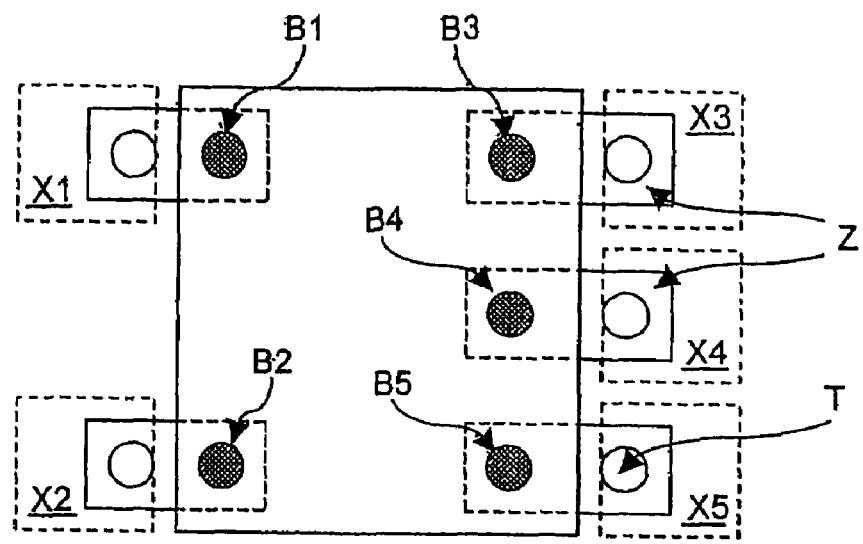

There are several techniques for producing the intermediate area connecting tracks. In the case of a flip chip module, the internal and external connecting areas are advantageously photo-etched onto the film constituting the support of the module. It is similarly easy to create the connecting tracks between said intermediate connecting areas, also by photo-etching, during the same operation. Thus a single set of masks may be used and the additional cost of implementing the present invention is therefore nil or negligible compared to the cost of producing a standard module as shown in FIG. 3 and FIG. 15.

In the case of a wire bonded module, the intermediate internal areas may also be produced by photo-etching. On the other hand, the tracks connecting these areas must be made on the bottom of the cavity, for example by embossing a metal film or by rubber stamp printing a conductive ink; in this connection see the applicant's patents EP0688051, FR-2736740, FR-2769389 and FR-2780847.

The electrical connections between the internal intermediate areas and the tracks intended to connect those areas may be provided by means of a conductive adhesive, for example, or an anisotropic adhesive. It is to be noted that these types of connection are used in the production of the dual interface cards referred to above (see also the patents FR-2716281 and DE 19647845, for example).

Figure 10:
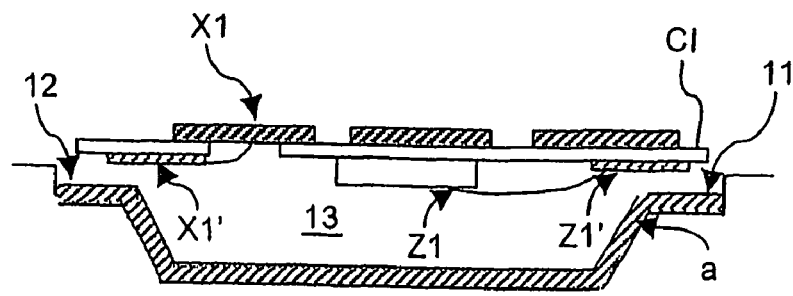
Figure 11:
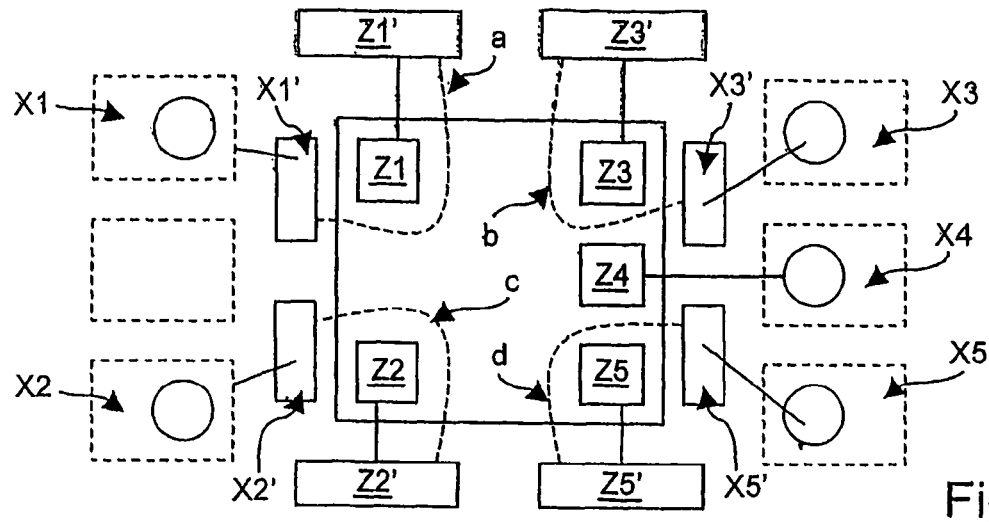
Figure 12:
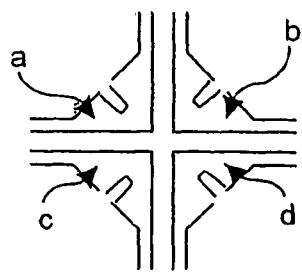
Figure 13:
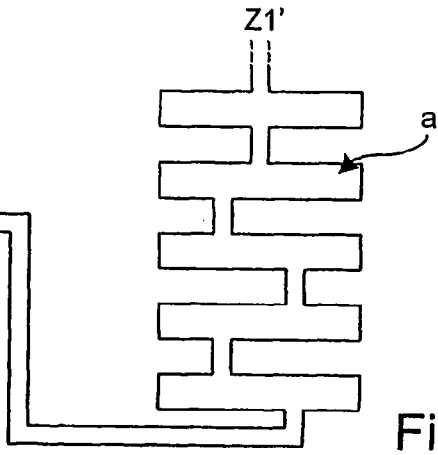
Figure 14:
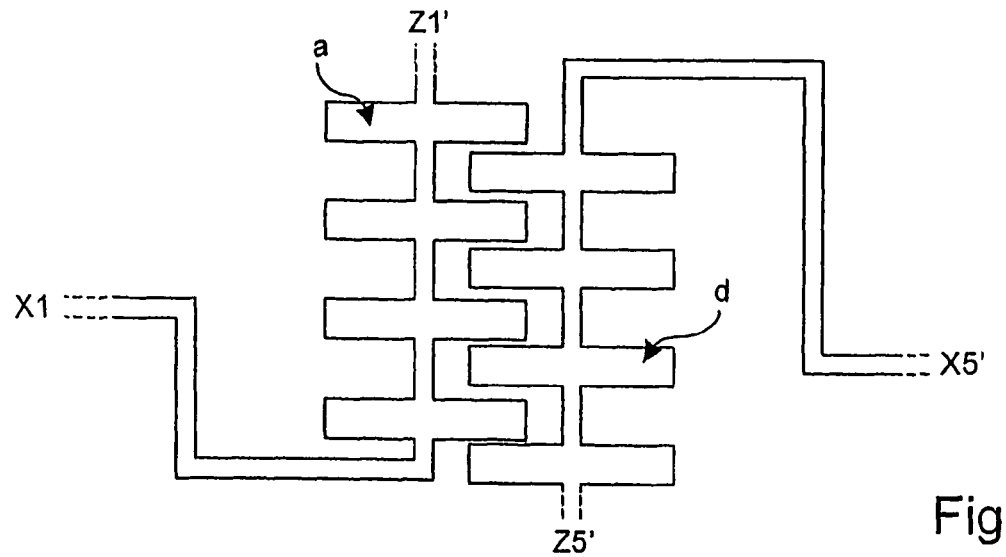
FIG. 14 is similar to FIG. 13, but with two connections a and d provided by tracks crossing the card, here along broken line paths.
Figure 17:
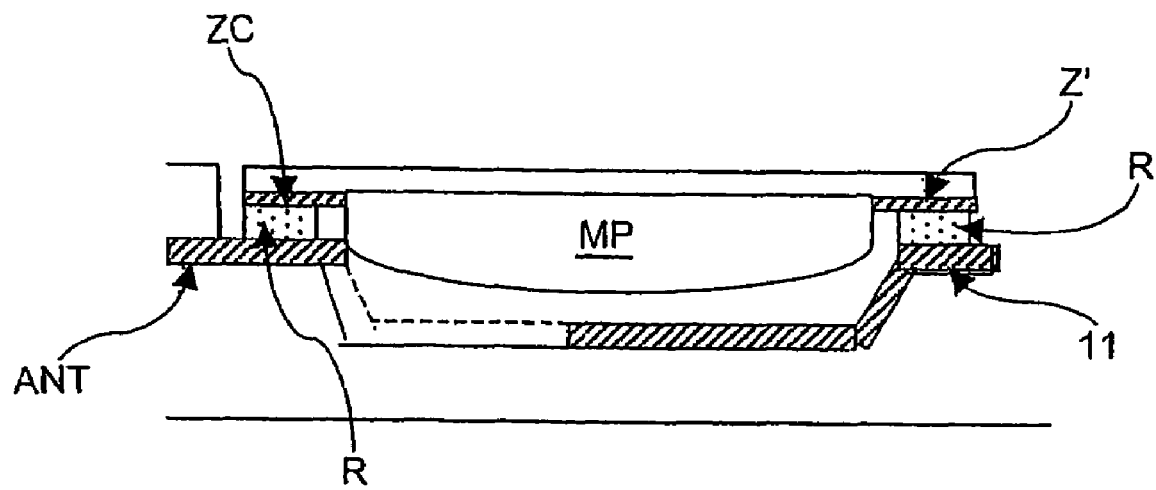
Figure 18:
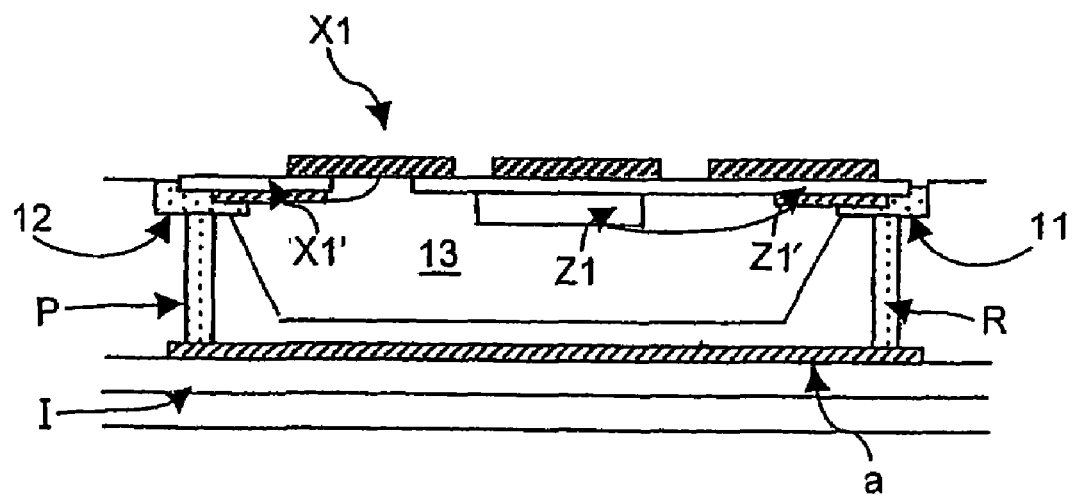

In the latter case, the additional cost linked to the use of conductive adhesives in accordance with the present invention disappears because said adhesives are used anyway for the electrical connections between the printed circuit and the antenna; accordingly, as is clear from FIG. 17, the same conductive or anisotropic adhesive or resin R is used to connect an internal connecting area ZC to the antenna ANT and to connect an internal intermediate area, such as the area Z', to an area on a plateau 11, as in FIG. 10.

It is finally to be noted that, in the case of a wire bonded module, the present invention ensures automatic electrical disconnection of the module in the event of separation of said module from the plastics material support. This feature meets a certain security requirement, in particular in the banking and identity card fields, relating to the fact that the module must not remain functional if separated from its plastics material support.

The invention claimed is:

1. Smart card including:
   a plastics material body,
   a module attached to that body and comprising a support carrying external electrical connection areas,
   at least one electronic microchip carried by said support and having an active face carrying internal electrical connection areas, and
   respective electrical connections between said external electrical connection areas and said internal electrical connection areas,
   characterized in that at least one of said connections includes a conductive track that is conformed and disposed so as to overlie the active face, visually concealing a significant portion thereof with at least one wide portion, and has at least one narrow portion adapted to bring about easy disconnection by breakage thereof in the event of moving that track or eliminating the whole or a portion of that track facing the active face.

2. Smart card according to claim 1, characterized in that at least certain of the connections include conductive tracks conformed and disposed so as to be conjointly complementary to conceal the major portion of said active face.

3. Smart card according to claim 2, characterized in that at least said conductive track consists of alternating patterns of larger area adapted to conceal visually a significant portion of said at least one electronic microchip and patterns of smaller area adapted to break easily in the event of an attempt to move that track or an attempt to eliminate the whole or a portion of that track facing the microchip.

4. Smart card according to claim 2, characterized in that, said at least one electronic microchip having its active face facing the bottom of the cavity in the plastics material body, at least said conductive track is formed on the bottom of said cavity and overlies said active face, concealing a significant portion thereof from visual observation.

5. Smart card according to claim 2, characterized in that, said at least one electronic microchip having its active face facing the support of the module opposite the external connecting areas, at least said conductive track is formed on an internal face of the support aligned with said active face and concealing a significant portion thereof from visual observation.

6. Smart card according to claim 1, characterized in that at least said conductive track consists of alternating patterns of larger area adapted to conceal visually a significant portion of said at least one electronic microchip and patterns of smaller area adapted to break easily in the event of an attempt to move that track or an attempt to eliminate the whole or a portion of that track facing the microchip.

7. Smart card according to claim 6, characterized in that, said at least one electronic microchip having its active face facing the bottom of the cavity in the plastics material body, at least said conductive track is formed on the bottom of said cavity and overlies said active face, concealing a significant portion thereof from visual observation.

8. Smart card according to claim 6, characterized in that, said at least one electronic microchip having its active face facing the support of the module opposite the external connecting areas, at least said conductive track is formed on an internal face of the support aligned with said active face and concealing a significant portion thereof from visual observation.

9. Smart card according to claim 1, characterized in that, said at least one electronic microchip having its active face facing the bottom of the cavity in the plastics material body, at least said conductive track is formed on the bottom of said cavity and overlies said active face, concealing a significant portion thereof from visual observation.

10. Smart card according to claim 9, characterized in that said conductive track is formed on the bottom and lateral walls of said cavity.

11. Smart card according to claim 9, characterized in that said conductive track is embedded in the plastics material body.

12. Smart card according to claim 11, characterized in that said conductive track is carried by an inlet embedded in the plastics material body and is connected to conductive wells (P, R).

13. Smart card according to claim 1, characterized in that, said at least one electronic microchip having its active face facing the support of the module opposite the external connecting areas, at least said conductive track is formed on an internal face of the support aligned with said active face and concealing a significant portion thereof from visual observation.

14. Smart card according to claim 1, characterized in that at least said conductive track is formed on the bottom of said cavity, being electrically connected to a first intermediate area formed on an internal face of the support of the module and electrically connected to one of the internal connecting areas and to a second intermediate area electrically connected to an external connecting area.

15. Smart card according to claim 1, characterized in that at least said conductive track is produced by photo-etching.

16. Smart card according to claim 1, characterized in that at least said conductive track is produced by depositing a conductive ink.

17. Smart card according to claim 1, characterized in that at least said conductive track is produced by stamping or embossing a metal film.

18. Smart card according to claim 1, characterized in that it said smart card includes an internal antenna electrically connected to said at least one microchip.

* * * * *